United States Patent [19]

Soclof

[11] 4,415,371
[45] Nov. 15, 1983

[54] METHOD OF MAKING SUB-MICRON DIMENSIONED NPN LATERAL TRANSISTOR

[75] Inventor: Sidney I. Soclof, San Gabriel, Calif.

[73] Assignee: Rockwell International Corporation, El Segundo, Calif.

[21] Appl. No.: 220,400

[22] Filed: Dec. 29, 1980

[51] Int. Cl.³ .................... H01L 21/22; H01L 21/31
[52] U.S. Cl. .................................. 148/1.5; 29/576 B; 29/578; 148/175; 148/187; 357/34; 357/91
[58] Field of Search .................... 148/1.5, 187, 175; 29/576 B, 578; 357/34, 91

[56] References Cited

U.S. PATENT DOCUMENTS

| | | | |
|---|---|---|---|
| 4,047,975 | 9/1977 | Widman | 148/1.5 |
| 4,140,558 | 2/1979 | Murphy et al. | 148/175 |
| 4,211,582 | 7/1980 | Horng et al. | 148/187 |
| 4,264,382 | 4/1981 | Anantha et al. | 148/187 |
| 4,309,812 | 1/1982 | Horng et al. | 29/578 |
| 4,318,751 | 3/1982 | Horng | 148/1.5 |
| 4,339,767 | 7/1982 | Horng et al. | 357/50 |

OTHER PUBLICATIONS

Berndlmaier et al. IBM-TDB, 22 (1980) 4543.
Brack et al. IBM-TDB, 16 (1974) 3287.

*Primary Examiner*—Upendra Roy
*Attorney, Agent, or Firm*—H. Fredrick Hamann; Wilfred G. Caldwell

[57] ABSTRACT

An array of hundreds of devices may be simultaneously processed on a chip to sub-micron dimensions by establishing tiny active regions for each transistor surrounded by field oxide filled motes or slotted regions, wherein the slots are utilized to dope the substrate within the action region. The N type substrate is double energy boron planted through one surface to establish a P region to a given depth. This surface is oxidized and photoresist masked conventionally to open regions for the slots which are ion milled or ODE etched to a given depth. N+ regions are established by the slots by ion implanting at an angle such that the entire depth of the slot is not doped but rather the doping is confined to a region within the double energy P implanted depth. Drive-in diffusion enlarges the N+ areas for the emitter and collecter and oxidation fills the mote insulating regions around the active area.

The oxide is stripped and the P region enhanced to P+ at the surface, with silox being deposited and opened for metal contacts to the P+ region for the base and the emitter and collector regions. The doping profile of the base region provides a potential barrier to minimize the flow of electrons toward the surface because the emitter electrons are channeled through the less heavily doped part of the base region to the collector.

6 Claims, 10 Drawing Figures

METHOD OF MAKING SUB-MICRON DIMENSIONED NPN LATERAL TRANSISTOR

FIELD OF THE INVENTION

The invention comprises a tiny transistor and process for manufacturing the same utilizing doping of the action region via boundary slots subsequently filled with field oxide to isolate each transistor of an array on a chip.

BACKGROUND OF THE INVENTION

The prior art has dimensionally resolved sub-micron fabrication techniques comparable than even smaller to or the thicknesses of thermally grown silicon oxide layers on silicon. Also, the dimensions are now comparable to or even smaller than the base widths used for double diffused transistors, e.g. approximately 0.4–1.0 micrometers. Drawing from these techniques a unique process and device in the form of a lateral NPN bipolar transistor comprises the subject of this invention.

SUMMARY OF THE INVENTION

An NPN lateral transistor on an N-doped substrate having an active region surrounded by field oxide in which N+ doped portions of the active region serve as the emitter and collector and a (P+/P) doped region comprises the base. The P doping is achieved by implanting the upper level of the substrate with P doping material and the N doping is achieved by implanting the slot walls above the P depth with N doped material. The latter is driven in, the slots are filled with field oxide and contacts are made to the three electrodes.

DESCRIPTION OF THE PREFERRED EMBODIMENT

Figure 1:
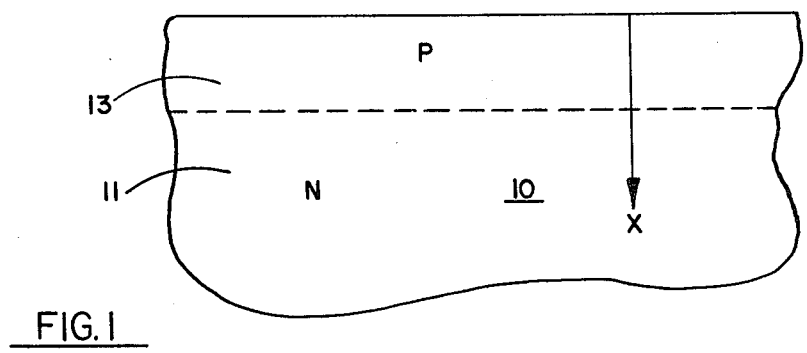
FIG. 1 is a view of a portion of a substrate to show the double energy boron implant for the P region.

A preferred method for forming the novel sub-micron dielectrically isolated NPN bipolar transistor is set forth in connection with the following figures, but it will be realized that certain steps may be substituted such as the slots may ion milled or ODE etched provided that the surface being attacked is (110). Similarly, doping may be accomplished in various ways as is conventionally known. However, certain features of the present process uniquely form the subject invention, e.g. the double energy boron implant illustrated in FIG. 1 employs a high energy and a low energy implanting step to convert the upper portion of the N-type substrate 11 to P-type shown at 13.

Figure 2:
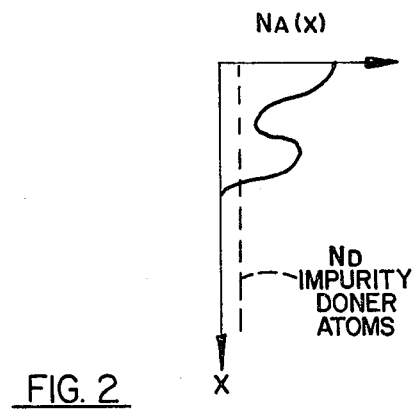
FIG. 2 is a diagram of distance of penetration and boron acceptor concentration.

Reference to FIG. 2 shows the double energy distribution of boron acceptors versus the distance of implant illustrated on the axis marked x with $N_d$ indicating the impurity donor atoms constant concentration.

Figure 3:
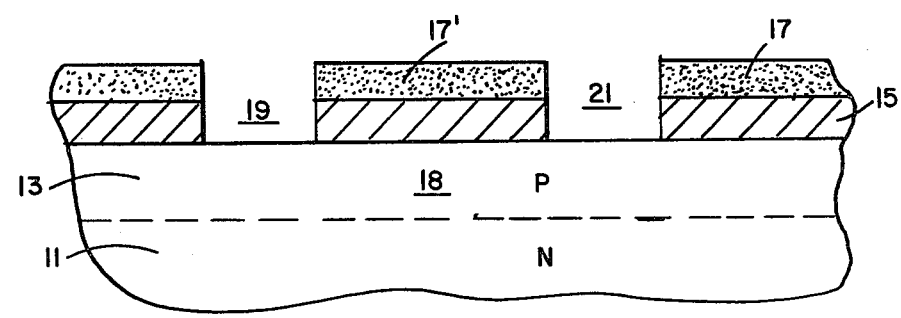
FIG. 3 shows the boron implanted substrate oxidized, and patterned using a photoresist and mask to outline the moat or slots or recesses surrounding the protective active region for a single transistor.

In FIG. 3 the substrate 11 has been oxidized as shown by the silicon oxide layer 15, covered with a photoresist layer 17 and masked, exposed to actinic radiation, and the soluble portions of the photoresist dissolved along with removal of the silicon oxide layer 15 therebeneath, as shown in the regions 19 and 21. Regions 19 and 21 are opened to the substrate 11 in order that the slots 23 and 25 of FIG. 4 may be formed therein. The photoresist portion 17' covers the active region 18 of the transistor being formed.

Figure 4:
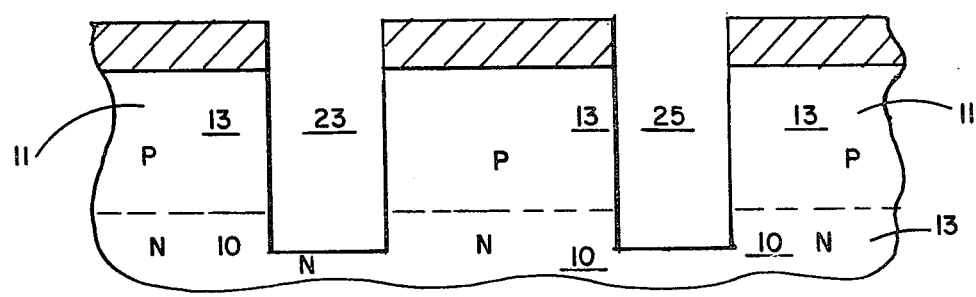
FIG. 4 shows the slots or boundary moats or recesses formed into the substrate.

In FIG. 4 the slots 23 and 25 are made by ion milling or ODE etching with e.g. KOH provided that the upper surface of the substrate is (110). It should be noted that the depth of the slots 23 and 25 is deeper than the P region and extends into the N region 10 of the substrate 11.

Figure 5:
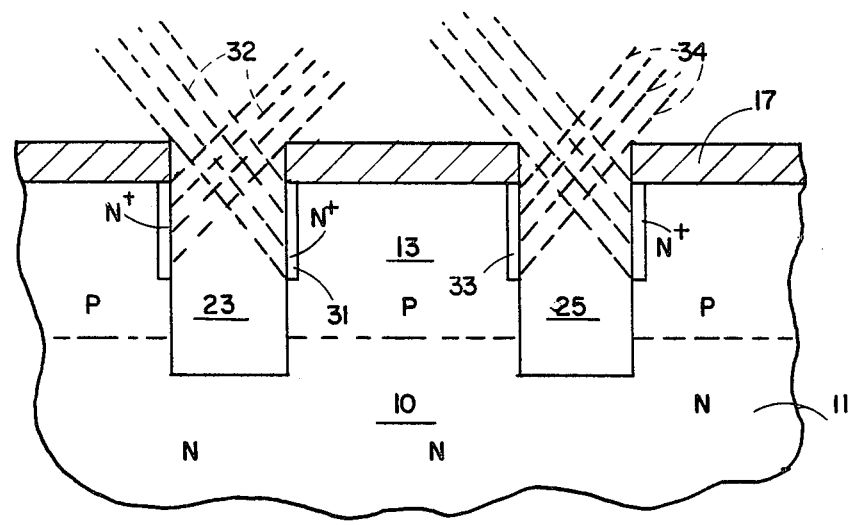
FIG. 5 illustrates the step of ion implanting the N+ regions at an angle to the direction of the slots in order that only the upper portion of the slots are doped.

In FIG. 5 it may be seen that the N+ regions 31 and 33 are implanted by ion implanting at an angle as illustrated by the ion beams 32 and 34. It is important to note that the angle of the ion beams relative to the slot directions is such that the N+ implanting does not extend to the full depth of the slots 23 and 25. Actually the corners of the silicon dioxide layer 17 form a shadowing effect and cooperate with the orientation of the beam 32 and 34 in fixing the N+ doped regions within the P region 13. Phosphous or other donors may be employed in this step.

Figure 6:
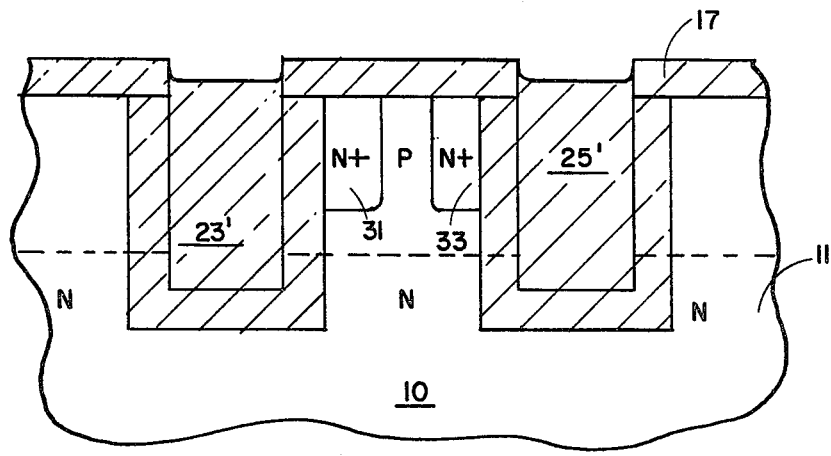
FIG. 6 shows the structure of FIG. 5 after the N+ doping has been driven in and following an oxidation step which fills in the slots.

In FIG. 6 it may be seen that the doping has been driven in and the N+ regions 31 and 33 considerably enlarged. This may be accomplished though the application of heat over a controlled period of time and temperature. The next step also illustrated in FIG. 6 is the growing of oxide 23' and 25' in the slots 23 and 25 to provide an insulating barrier around the active region where the transistor is being formed. It will be noted that the silicon oxide grows both into the substrate 11 but principally outwardly to fill the slots as shown at 23' and 25'.

Figure 7:
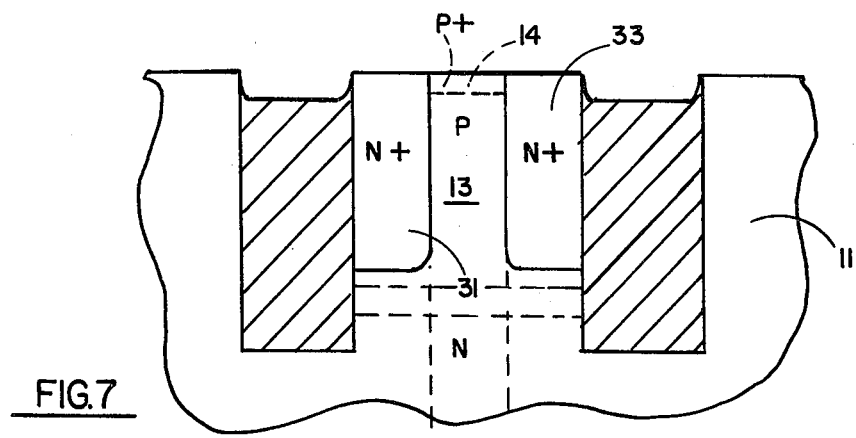
FIG. 7 illustrates the enhanced P+ boron implanted region following oxide stripping and prior to deposition of silox and opening the same for metal contact.

Referring now to FIG. 7, the silicon oxide is stripped from the substrate 11 and boron is implanted to enhance the P region 13 as shown by the P+ in the surface region 14. Then a silox deposition is made to cover the entire chip and openings are provided through the silox layers to make contact with the N+ region 31 to serve as the emitter, N+ region 33 as the collector and P+ region 14 as the base.

Figure 8:
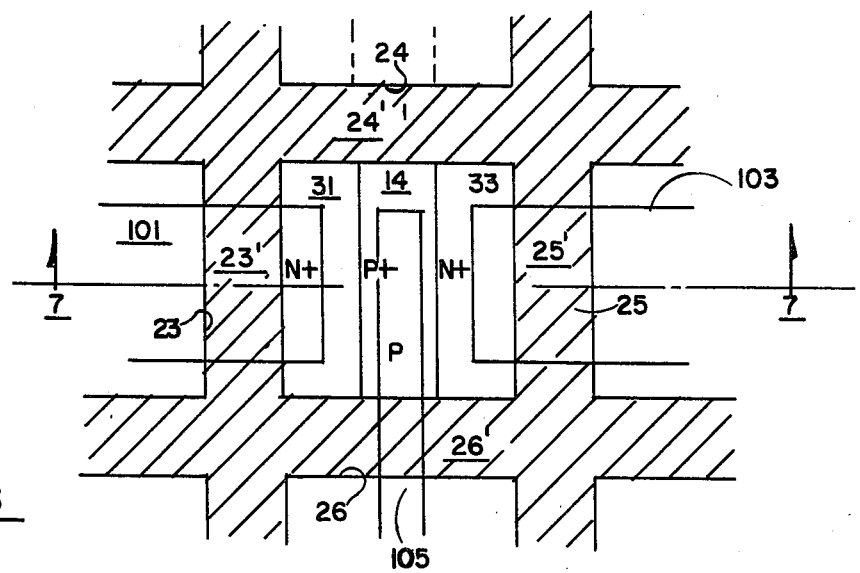
FIG. 8 is a view in top plan of the single transistor formed within the surrounding boundary silicon oxide insulation and additionally showing the metal connections to the emitter, base and collector.

This is better shown in FIG. 8 wherein the emitter electrode comprises a metal layer 101 extending over the N+ region 31, the collector electrode is shown at 103 in electrical connection with N+ region 33 and the P+ or base electrode is shown at 105 in contact with P+ region 14. It may also be appreciated that the slots 23 and 25 are visible shown filled with the silicon oxide 23' and 25'. Also, the rest of the boundary comprises the slots 24 and 26 filled with silicon oxide 24' and 26'.thereby completing the surrounding of the transistor active area with insulation. It may also help to note that the cross-sectional plane of FIG. 7 is taken along the plane 7—7 of FIG. 8 and it is for this reason that the slots 24 and 26 were not visible in previous figures.

Figure 9A:
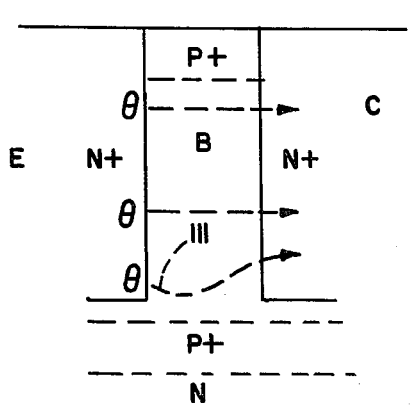
FIGS. 9a and 9b show the doping profile of the base region in the transistor to illustrate a potential barrier minimizing the flow of electrons toward the surface and also toward the substrate with the chart illustrating the channeling obtained less heavily doped part of the base region to the collector.
Figure 9B:
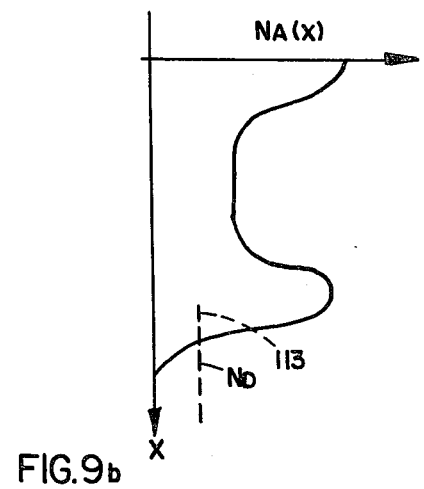

Referring now to FIGS 9a and 9b, the doping profile of the base region 14 may be seen to be such that a potential barrier is set up to minimize the flow of electrons toward the surface of substrate 11 and also toward the substrate as shown in FIG. 9a by electron path 111.

This gradient that influences the electron flow is occasioned by the double energy boron implantation with the distribution shown in FIG. 9b wherein the horizontal access is illustrated by $N_A$ wherein the N and the A are both caps (x) to indicate the boron acceptors and the vertical axis is indicated by the little x indicating distance of penetration with dotted line 113 showing impurity donor atoms $N_D$.

The electrons emitted by emitter 31 are essentially channeled through the less heavily doped part of the base region 14 to the collector 33. This feature also allows for a high current gain (beta) and also for operation at very low current levels, i.e. donor acceptors.

Advantages presented by the invention are the fact that the parasitic component of the junction capacitances between collector and base and emitter and base has been almost completely eliminated. Also, the base spreading resistance is greatly reduced since the base contact is directly over the active portion of the base region. Only the substrate parasitic base to substrate capacitance is not substantially reduced.

While the principles of the invention have been illustrated and described, it will occur to those skilled in the art that other processing may be substituted for certain steps, as previously mentioned, and accordingly the scope of the invention is intended to be defined by the claims set forth hereinafter, wherein:

What is claimed is:

1. A method for forming an array of sub-micron dimensioned NPN lateral transistors on a substrate doped n-type, wherein each transistor is formed comprising the following steps:
   implanting P-type impurities into the substrate for a given depth;
   masking the substrate to outline boundary regions for each active region to comprise a transistor;
   slotting the substrate in said boundary regions beyond said depth;
   doping the substrate active regions via opposed inner sidewalls of a first pair of boundary slots at spaced apart three dimensional regions adjacent the respective inner sidewalls the slotted boundary regions to a depth less than said given depth to render said three dimensional regions above said depth N+ doped;
   filling the doped slotted boundary regions with field oxide and driving in the doped three dimensional regions;
   doping the upper portion of the active region of each transistor by implanting P+ type doping except for the N+ portions thereof; and,
   metallizing and patterning said substrate surface to provide electrical connections to each of said N+ regions and to said P+ region.

2. The method of claim 1, wherein:
said slotting is achieved by one of ion milling and ODE etching for a (110) surface of said substrate.

3. The method of claim 1, wherein:
said implanting is a double energy boron implant.

4. The method of claim 1, wherein:
doping via the inner sidewalls in the slotted boundary regions is achieved by ion implant at acute angles to the substrate surface such that the implanting is confined to an upper portion of the slot depth.

5. The method of claim 1, wherein:
said metallization and patterning is achieved by depositing a layer of silicon oxide over the substrate, and opening contact areas to each of said N+ regions and to said P+ region for metallization.

6. The method of claim 3, wherein:
the doping profile of said P and P+ regions provides a potential barrier to minimize electron flow toward the substrate surface by channelling electrons through the less heavily doped P region from one N+ region to the other N+ region in said active transistor region.

* * * * *